(12) United States Patent
Ogihara et al.

(10) Patent No.: US 7,910,283 B2
(45) Date of Patent: *Mar. 22, 2011

(54) SILICON-CONTAINING ANTIREFLECTIVE COATING FORMING COMPOSITION, SILICON-CONTAINING ANTIREFLECTIVE COATING, SUBSTRATE PROCESSING INTERMEDIATE, AND SUBSTRATE PROCESSING METHOD

(75) Inventors: Tsutomu Ogihara, Joetsu (JP); Motoaki Iwabuchi, Joetsu (JP); Takeshi Asano, Joetsu (JP); Takafumi Ueda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 563 days.

This patent is subject to a terminal disclaimer.

(21) Appl. No.: 11/595,941

(22) Filed: Nov. 13, 2006

(65) Prior Publication Data
US 2007/0117252 A1 May 24, 2007

(30) Foreign Application Priority Data
Nov. 21, 2005 (JP) .................................. 2005-335264

(51) Int. Cl.
G03F 7/039 (2006.01)
G03F 7/11 (2006.01)

(52) U.S. Cl. ..................... 430/270.1; 525/474; 526/245; 522/148; 430/272.1

(58) Field of Classification Search .......................... None
See application file for complete search history.

(56) References Cited

U.S. PATENT DOCUMENTS

| | | | |
|---|---|---|---|
| 5,632,910 A | 5/1997 | Nagayama et al. | |
| 6,025,117 A | 2/2000 | Nakano et al. | |
| 6,268,457 B1 | 7/2001 | Kennedy et al. | |
| 6,280,898 B1 | 8/2001 | Hasegawa et al. | |
| 6,329,125 B2 | 12/2001 | Takechi et al. | |
| 6,703,183 B2 | 3/2004 | Nishi et al. | |
| 7,678,529 B2 * | 3/2010 | Ogihara et al. | 430/270.1 |
| 2002/0142586 A1 * | 10/2002 | Shiota | 438/633 |
| 2004/0247900 A1 | 12/2004 | Ogihara et al. | |
| 2005/0016499 A1 | 1/2005 | Noda et al. | |
| 2006/0019195 A1 | 1/2006 | Hatakeyama et al. | |

FOREIGN PATENT DOCUMENTS

| | | |
|---|---|---|
| EP | 0336404 A2 | 10/1989 |
| JP | 7-183194 A | 7/1995 |
| JP | 8-12626 A | 1/1996 |
| JP | 9-73173 A | 3/1997 |
| JP | 11-60735 A | 3/1999 |
| JP | 2000044876 A * | 2/2000 |
| JP | 2000-159758 A | 6/2000 |
| JP | 2003-84438 A | 3/2003 |
| JP | 5-310942 A | 11/2003 |
| JP | 2004-153125 A | 5/2004 |
| JP | 2004-349572 A | 12/2004 |
| JP | 2005-18054 A | 1/2005 |
| JP | 2005-128509 A | 5/2005 |
| JP | 2005-146252 A | 6/2005 |
| WO | WO-91/13002 A1 | 9/1991 |
| WO | WO-00/01684 A1 | 1/2000 |

OTHER PUBLICATIONS

Kimura et al, English translation of JP, 05-310942, A (1993) from machine translation from AIPN Japan Patent Office National Center for Industrial Property Information and Training, generated Jun. 4, 2009, 9 pages.*

Okazaki, English translation of JP 2000-44876 A (2000) from machine translation from AIPN Japan Paten Office Naitional Center for Industrial Property information and Training, Generated Jun. 6, 2009, 13 pages.*

Ito et al., Polym. Mater. Sci. Eng., 1997, 77, pp. 449-450.

Wilkinson et al. (eds), Comprehensive Organometallic Chemistry, vol. 2, 389, (1982), pp. 365-397.

* cited by examiner

*Primary Examiner* — Cynthia Hamilton
(74) *Attorney, Agent, or Firm* — Birch, Stewart, Kolasch & Birch, LLP

(57) ABSTRACT

A composition for forming an antireflective coating for use in a photolithography process using exposure light of up to 200 nm comprises a silicon-containing polymer obtained through hydrolytic condensation of a silicon-silicon bond-containing silane compound having formula: $R_{(6-m)}Si_2X_m$ wherein R is a monovalent hydrocarbon group, X is alkoxy, alkanoyloxy or halogen, and m is 3 to 6. The composition allows the overlying photoresist film to be patterned to a satisfactory profile and has a high etching selectivity relative to organic material so that a substrate can be processed at a high accuracy.

4 Claims, No Drawings

US 7,910,283 B2

SILICON-CONTAINING ANTIREFLECTIVE COATING FORMING COMPOSITION, SILICON-CONTAINING ANTIREFLECTIVE COATING, SUBSTRATE PROCESSING INTERMEDIATE, AND SUBSTRATE PROCESSING METHOD

CROSS-REFERENCE TO RELATED APPLICATION

This non-provisional application claims priority under 35 U.S.C. §119(a) on Patent Application No. 2005-335264 filed in Japan on Nov. 21, 2005, the entire contents of which are hereby incorporated by reference.

TECHNICAL FIELD

This invention relates to a composition suitable for forming a silicon-containing antireflective coating used in photolithography in the semiconductor device manufacture technology; a silicon-containing antireflective coating; a substrate processing intermediate and a substrate processing method using the same.

BACKGROUND ART

Seeking for higher integration and operating speeds in LSI devices, the semiconductor technology places a continuous demand for semiconductor devices of finer size. Through consecutive numerous improvements, the photolithography used in processing of such semiconductor devices has achieved higher precision processing to finer feature sizes. With respect to the light source of exposure light used in the lithography, for example, light sources of shorter wavelength are used in order to define finer images. The recent lithography experienced a transition from i-line of 365 nm to KrF excimer laser (248 nm) and further to ArF excimer laser (193 nm), and all these lithography processes have already been used in practice.

However, problems arise if exposure light of a single wavelength is used in carrying out a microfabrication process as mentioned above. As is well known from the past, standing waves generate due to the interference of incident light with reflected light from a substrate. It is also known that a phenomenon called halation occurs due to collection or scattering of light by irregularities on a substrate. Both standing waves and halation incur variations in size such as pattern line width and pattern collapse. For suppressing halation and standing waves, several attempts have been made including incorporation of light absorbers in resist film, and provision of antireflective coatings on the resist top surface and substrate surface. For the microprocessing accuracy currently required, the most effective method is the provision of an antireflective coating immediately below the resist film.

The materials of antireflective coating (ARC) are generally classified into inorganic and organic materials. The organic materials are advantageous in that they can be spin coated, eliminating a need for special equipment like CVD and sputtering equipment, that their coatings can be peeled simultaneously with the resist film, and that their coatings are free of footing, conformable in shape, and fully adherent to the resist film. Thus antireflective coatings based on many organic materials have been proposed. However, the antireflective coatings based on the prior art type of organic polymer materials rely on the design that light absorption is assigned to aromatic groups or conjugated double bonds. The design inevitably entails an increased carbon density and higher dry etching resistance, leading to the drawback that the dry etching selectivity of ARC is not so high relative to the resist film.

On the other hand, as the wavelength of exposure light is reduced, the base polymer in the resist film is desired to be transparent to shorter wavelength for meeting the requirement of transmittance to exposure light. In the lithography using ArF excimer laser light, polymers of polyacrylic acid esters having alicyclic skeletons on side chains are frequently used. In terms of etching resistance, these polymers are less resistant to etching, as compared with novolac resins used in the i-line lithography and polyhydroxystyrene polymers used in the KrF excimer laser lithography.

To prevent an excessive load from being applied to the resist pattern during etching of an ARC, an ARC having a high etching selectivity ratio relative to the resist film, that is, a higher etching speed is required. Several methods for the formation of such ARC's were announced while one typical method of the basic design of increasing the etching selectivity ratio relative to the resist film is to incorporate silicon into polymers. The reason is that the organic resist films exhibit relatively satisfactory etching resistance to dry etching with a fluorine gas plasma, whereas silicon compounds exhibit a high etching speed under the same conditions.

Specific examples of the ARC's include a polysilane polymer having a pendant light-absorbing skeleton (JP-A 11-60735), and a spin-on-glass (SOG) composition comprising a polysiloxane polymer having a light-absorbing skeleton substituted on side chain (U.S. Pat. No. 6,268,457). The research team of the inventors proposed in JP-A 2005-18054 (US 20040247900A) an ARC of the type which can be formed under milder conditions than the SOG type ARC. Specifically, the coating is formed by crosslinking through organic crosslink groups between siloxane polymers having a light-absorbing skeleton chemically bonded. It has been found that a side chain having a silicon-silicon bond is a substituent group capable of efficiently absorbing the wavelength of ArF excimer laser.

The ARC's using silicon base polymers also have drawbacks which must be overcome. In the case of the SOG material which is provided with a light absorbing function by bonding an aromatic skeleton to a side chain, for example, aromatic rings must be incorporated above a certain level in order to ensure a sufficient light absorbing function while it is impossible to increase the dry etching rate above a certain limit. In the case of the polysilane, a light absorbing capacity is ascribed to not only the light absorbing group on the side chain, but also consecutive Si—Si bonds is expectable, but the synthesis is fairly complex as compared with polysiloxanes. In the case of a siloxane skeleton having on a side chain a polysilane moiety which is free from the effect of reducing the etching rate of fluorine dry etching, noticeable modification is necessary to ensure the adhesion of the film because the polysilane moiety becomes considerably hydrophobic.

DISCLOSURE OF THE INVENTION

An object of the present invention is to provide a composition for forming a silicon-containing antireflective coating, which is reached by improving a material having a sufficient etching ratio relative to organic resist films and which has a higher etching selectivity ratio and can be easily adjusted so as to impart the desired properties to the coating; a silicon-containing antireflective coating; a substrate processing intermediate comprising the same; and a substrate processing method using the same.

Polysilsesquioxanes having Si—Si bonds are disclosed in JP-A 5-310942. Although the mechanism is not disclosed in detail, the use of polysilsesquioxanes in photoresist compositions and photo-reactive materials is indicated. The inventors have found that these materials can constitute one solution to the outstanding problems when they are used as the antireflective coating rather than the resist film itself.

Since hydrolyzable silanes having the general formula (1) are relatively readily available and relatively easy to modify their side chain, polysiloxane polymers obtained therefrom are easy to adjust their physical properties. They are also ready for co-hydrolytic condensation with hydrolyzable silanes having the general formula (2), many variations of which are readily available. It is known from Comprehensive Organometallic Chemistry, Vol. 2, 389 (1982) that the Si—Si bonds, the units of formula (1) possess, have sufficient absorption in proximity to the wavelength 193 nm of ArF excimer laser. Thus an attempt to select the type of side chain used as part of the polymer backbone for the purpose of absorbing light of the wavelength 193 nm at a higher efficiency than polysilane is made at a high degree of freedom.

In a first aspect, the invention provides a coating composition for forming a silicon-containing antireflective coating for use in a photolithography process using exposure light with a wavelength of up to 200 nm, the composition comprising a silicon-containing polymer obtained through hydrolytic condensation of a reaction solution comprising at least one silicon-silicon bond-containing hydrolyzable silane compound having the general formula (1):

$$R_{(6-m)}Si_2X_m \quad (1)$$

wherein R is each independently a substituted or unsubstituted monovalent hydrocarbon group of 1 to 20 carbon atoms, X is each independently an alkoxy group, alkanoyloxy group or halogen atom, and m is a number from 3 to 6. The use of a hydrolyzable silane compound having formula (1) ensures a light absorbing function ascribed to Si—Si bonds, and by virtue of this absorption, the number of aromatic light absorbing groups to be incorporated in R can be significantly reduced or even such groups can be eliminated, whereby a decline of etching rate is suppressed.

In one preferred embodiment, the silicon-containing polymer is obtained through co-hydrolytic condensation of a silane mixture comprising at least one hydrolyzable silane compound having the general formula (1) and at least one hydrolyzable silane compound having the general formula (2):

$$A_aSiB_{(4-a)} \quad (2)$$

wherein A is each independently hydrogen or a substituted or unsubstituted monovalent hydrocarbon group of 1 to 20 carbon atoms, B is each independently an alkoxy group, alkanoyloxy group or halogen atom, and a is 0 or 1. The use of a hydrolyzable silane compound having formula (2) enables more precise control because many variations of the compound are available and a choice may be made among them so as to meet the desired physical properties to acquire adhesion to a resist film or the like, as described above.

The antireflective coating forming composition may further comprise modifiers such as an acid generator and a surfactant. These components are dissolved in an organic solvent. The modifiers enable the composition to form a film of quality by virtue of the action to be described later.

When the silicon-containing polymer is obtained through hydrolytic condensation of a silane mixture comprising a plurality of silane compounds having the general formula (1), a silane mixture in which the compound of formula (1) wherein m is equal to 4 or 3 is predominant is preferably subjected to hydrolytic condensation. This facilitates to produce a condensate having desired physical properties.

A polymer having desired physical properties for shelf stability and coating ability is more often formed when the mixture contains the silane compound of formula (1) wherein m is 4 and the silane compound of formula (1) wherein m is 3 in a molar ratio between 3:7 and 7:3.

Preferably, the silicon-containing polymer has a weight average molecular weight of up to 20,000, and contains not more than 5% by weight, based on the entire silicon-containing polymer, of a polymer having a weight average molecular weight of up to 500. Such a polymer ensures coating efficiency and film uniformity.

In a preferred embodiment, the silane compounds are selected so that the silicon-containing polymer satisfies the relationship: $0.05 \leq M/(L+M+N) \leq 0.14$ wherein L is the number of Si—O bonds, M is the number of Si—Si bonds, and N is the number of Si—C bonds per polymer unit weight. Satisfying this relationship makes it easy to find a combination capable of satisfying other desired conditions and enables the necessary light absorbing capacity to be achieved solely by Si—Si bonds.

In a second aspect, the invention provides an antireflective coating formed from the composition described above.

In a third aspect, the invention provides a substrate processing intermediate for use in the processing of a patternable substrate, comprising in sequence: the patternable substrate, an antireflective coating as described above, and a photoresist film. The substrate processing intermediate may further comprise an inorganic film between the patternable substrate and the antireflective coating.

In another embodiment, a substrate processing intermediate for use in the processing of a patternable substrate is prepared by forming an organic film having an aromatic skeleton on the patternable substrate, forming an inorganic film which is dry etchable with a fluorine gas on the organic film, forming an antireflective coating as described above on the inorganic film, and forming a photoresist film on the antireflective coating.

In a further embodiment, a substrate processing intermediate for use in the processing of a patternable substrate having steps is prepared by forming a planarizing film comprising a silicon-containing polymer on the patternable substrate to provide a planar surface, forming an antireflective coating as described above on the planarizing film, and forming a photoresist film on the antireflective coating.

A still further embodiment is a substrate processing intermediate as defined above, wherein the photoresist film is a resist film, or specifically a positive resist film, comprising a poly(meth)acrylic acid ester. In a still further embodiment, the photoresist film comprises a polymer with a side chain having an alcoholic functional group which exhibits acidity by fluorine substitution on the adjacent carbon.

In a fourth aspect, the invention provides a method of processing a patternable substrate using the antireflective coating according to the invention. Where the patternable substrate is to be dry etched with a fluorine gas plasma, the method comprises the steps of forming an antireflective coating directly on a patternable substrate, forming a photoresist film thereon, exposing the photoresist film to a pattern of light having a wavelength of up to 200 nm, post-treating and then developing the photoresist film to form a resist pattern, and dry etching the antireflective coating and the patternable substrate with a common gas system while using the resist pattern as an etching mask, for thereby transferring the pattern to the antireflective coating and the patternable substrate. Since the ARC of the invention has a high etching rate, the load applied to the resist can be reduced as compared with the prior art ARC's.

In another embodiment, the method of processing a patternable substrate comprises the steps of furnishing a substrate processing intermediate having an inorganic film between the patternable substrate and the antireflective coating; exposing the photoresist film to a pattern of light having a wavelength of up to 200 nm, post-treating and then developing the photoresist film to form a resist pattern; dry etching the antireflective coating and the inorganic film with a common gas system while using the resist pattern as an etching mask, for thereby transferring the pattern to the antireflective coating and the inorganic film; and processing the patternable substrate while using the patterned inorganic film as an etching mask. The ARC of the invention reveals the same etching propensity as the above-mentioned hard mask materials such as silicon and titanium based materials. Unlike conventional organic ARC, the inventive ARC can thus be etched under the same conditions as the inorganic film. At the same time, the load applied to the photoresist film is reduced as compared with the conventional silicon-containing ARC.

In a further embodiment, the method of processing a patternable substrate comprises the steps of furnishing a substrate processing intermediate comprising an aromatic skeleton-bearing organic film between a patternable substrate and an antireflective coating and an inorganic film on the organic film which can be dry etched with a fluorine gas; exposing the photoresist film to a pattern of light having a wavelength of up to 200 nm, post-treating and then developing the photoresist film to form a resist pattern; dry etching the antireflective coating and the inorganic film with a common gas system while using the resist pattern as an etching mask, for thereby transferring the pattern to the antireflective coating and the inorganic film; dry etching the organic film while using the patterned antireflective coating and inorganic film as a mask, for thereby transferring the pattern to the organic film; and dry etching the patternable substrate while using the patterned organic film as a mask, for thereby transferring the pattern to the substrate. Since the ARC of the invention has a high etching rate, the load applied to the resist can be reduced as compared with the prior art ARC's.

In a still further embodiment, the method of processing a patternable substrate comprises the steps of forming a planarizing film containing a silicon-containing polymer on a patternable substrate having steps to provide a planar surface, forming an antireflective coating thereon to provide a substrate processing intermediate; exposing the photoresist film to a pattern of light having a wavelength of up to 200 nm, post-treating and then developing the photoresist film to form a resist pattern; and dry etching the antireflective coating and the planarizing film comprising a silicon-containing polymer with a fluorine gas while using the resist pattern as an etching mask. Since the ARC of the invention has a high etching rate, the load applied to the resist can be reduced as compared with the prior art ARC's.

In a still further embodiment, the photoresist film in the substrate processing intermediate is formed of a positive resist composition comprising a poly(meth)acrylic acid ester, whereby a high resolution is achievable. Precise processing is possible because the ARC of the invention allows for a high etching selectivity ratio relative to organic photoresists. Similarly, when the photoresist film comprises a polymer with a side chain having an alcoholic functional group which exhibits acidity by fluorine substitution on the adjacent carbon, the alcoholic functional group exhibiting acidity is expected to hold down the behavior that the polymer swells to cause pattern collapse during development, but tends to be poor in dry etching characteristics. Even in this case, the ARC of the invention is advantageously used.

The pattern forming method develops a more antireflective effect particularly when the light used in the exposing step is ArF excimer laser radiation.

BENEFITS OF THE INVENTION

The composition of the invention uses a polymer having a great absorbing capacity to light of up to 200 nm, which is relatively easily obtainable through hydrolytic condensation of a hydrolyzable silane comprising a hydrolyzable silane compound having formula (1), or specifically co-hydrolytic condensation of a hydrolyzable silane comprising hydrolyzable silane compounds having formulae (1) and (2). The composition is effective for forming a silicon-containing antireflective coating (ARC). The use of the polymer ensures that a photoresist film formed on the ARC is patterned effectively, and that the ARC has a high etching selectivity relative to organic materials so that the load applied to the resist film during dry etching of the ARC is significantly reduced. This enables high precision processing of a patternable substrate.

DESCRIPTION OF THE PREFERRED EMBODIMENT

The terms "a" and "an" herein do not denote a limitation of quantity, but rather denote the presence of at least one of the referenced item.

As used herein, the term "coating" is used interchangeably with "film" or "layer."

The abbreviation "ARC" denotes antireflective coating.

The terms "fluorine gas" and "fluorine dry etching" refer to a fluorine-containing gas and dry etching with a fluorine-containing gas, respectively. This is true to the same phrases of other elements like chlorine.

The polymer included in the composition of the invention for forming a silicon-containing antireflective coating is a siloxane polymer obtained through hydrolytic condensation of a hydrolyzable silane compound alone or a mixture thereof comprising at least one silane compound having the general formula (1).

$$R_{(6-m)}Si_2X_m \quad (1)$$

Herein R is each independently a substituted or unsubstituted monovalent hydrocarbon group of 1 to 20 carbon atoms, X is each independently an alkoxy group, alkanoyloxy group or halogen atom, and m is a number in the range: $3 \leq m \leq 6$.

In another embodiment, the polymer may be a silicon-containing polymer obtained through hydrolytic condensation of a mixture of hydrolyzable silanes comprising at least one silane compound having the above general formula (1) and at least one silane compound having the general formula (2).

$$A_a SiB_{(4-a)} \quad (2)$$

Herein A is each independently hydrogen or a substituted or unsubstituted monovalent hydrocarbon group of 1 to 12 carbon atoms, B is each independently an alkoxy group, alkanoyloxy group or halogen atom, and a is 0 or 1.

The proportion of the disilane compound of formula (1) and the monosilane compound of formula (2) used may be between 1:99 and 99:1 in molar ratio. The proportion is more preferably between 5:95 and 95:5, and even more preferably between 10:90 and 90:10.

In the silane compound (1), suitable examples of R include alkyl groups such as methyl, ethyl, n-propyl, isopropyl, n-butyl, isobutyl, sec-butyl, tert-butyl, n-pentyl, 2-ethylbutyl, 3-ethylbutyl, 2,2-diethylpropyl, cyclopentyl, n-hexyl, and cyclohexyl; alkenyl groups such as vinyl and allyl; alkynyl groups such as ethynyl; aryl groups such as phenyl and tolyl; aralkyl groups such as benzyl; and other unsubstituted monovalent hydrocarbon groups. Inter alia, methyl, ethyl, n-propyl, isopropyl and vinyl are most preferred.

Also useful are substituted forms of the foregoing monovalent hydrocarbon groups in which one or more hydrogen atoms are substituted by functional groups. Suitable functional groups include hydroxyl, epoxy, oxetanyl, amino, methylamino and dimethylamino groups, and fluorine, chlorine, bromine and iodine atoms. Inter alia, hydroxyl and epoxy groups are most preferred.

Suitable examples of X include alkoxy groups such as methoxy, ethoxy, n-propoxy, isopropoxy, n-butoxy, isobutoxy, sec-butoxy, t-butoxy, n-pentoxy, 2-ethylbutoxy, 3-ethylbutoxy, 2,2-diethylpropoxy, cyclopentyloxy, n-hexyloxy, and cyclohexyloxy; alkanoyloxy groups such as formyl, acetyl, propionyl, butyryl, isobutyryl, valeryl, isovaleryl, pivaloyl, and cyclohexylcarbonyl; and halogen atoms such as fluorine, chlorine, bromine and iodine. Of these, preference is given to methoxy, ethoxy, n-propoxy, isopropoxy, acetyl groups, and chlorine atoms.

The silane compound of formula (1) should have three or more X. Then the silane compound of formula (1) can be effectively incorporated in the polymer skeleton through co-hydrolysis with the compound of formula (2).

It is preferred that A and B in the silane compound (2) be selected from the selection ranges of R and X in the silane compound (1), respectively. If it is desired to introduce complex substituent groups into silane compounds, introducing such substituent groups into A may be advantageous from the standpoint of silane compound purification or the like. Where fine adjustment of physical properties of a film is necessary as in cases where it is desired to increase the crosslinking density or to control the surface energy of a film, the combined use of the silane compound (2) facilitates such adjustment.

When a plurality of silane compounds of formula (1) are used, it is preferred that a compound of formula (1) wherein m is equal to 4 or 3 be predominant because a polymer having better coating characteristics and shelf stability is obtained. If a compound wherein m is 5 or 6 is predominant in a silane mixture, hydrolytic condensation of the mixture results in a silicon-containing polymer containing a too much amount of residual silanol, which invites inconvenient problems during shelf storage, including declines of coating ability and shelf stability as demonstrated by formation of foreign matter due to recombination of silanol moieties and a thicker film from the aged coating solution. As used herein, the term "predominant" means that the relevant compound accounts for at least 40% by weight, especially at least 50% by weight of the entire silane compounds.

In the embodiment wherein a silane mixture comprising a plurality of silane compounds having formula (1) is used, a polymer with better physical properties is obtained when the mixture contains the silane compound of formula (1) wherein m is 4 and the silane compound of formula (1) wherein m is 3 in a molar ratio between 3:7 and 7:3. The compound with m=4 is effective in imparting a polar effect to the film surface so as to prevent the overcoat resist film from collapsing and to enlarge the process window, although the effect also depends more or less on a choice of R. Outside the range, a more proportion of the compound with m=3 may increase oil repellency, which is inherent to silicone resins, and thus cause striation when the overcoat resist film is coated thereon. Also outside the range, too high a proportion of the compound with m=4 has the tendency that the polymer contains a more amount of residual silanol, as mentioned above, leading to a decline of shelf stability.

The molecular weight of the silicon-containing polymer can be adjusted by a choice of monomers and by controlling reaction conditions during polymerization. Silicon-containing polymers having a weight average molecular weight in excess of 20,000 may, in some cases, cause formation of foreign matter and coating specks. It is thus preferred to use a silicon-containing polymer having a weight average molecular weight (Mw) of up to 20,000. With respect to the molecular weight distribution, if a silicon-containing polymer product contains more than 5% by weight of a polymer fraction with a Mw of up to 500 based on the entire polymer product, that fraction will volatilize off during baking before it undergoes crosslinking reaction, exacerbating the in-plane uniformity of the coated film. It is thus recommended to use a polymer product containing not more than 5% by weight of a polymer fraction with a Mw of up to 500. It is noted that weight average molecular weight data are determined by gel permeation chromatography (GPC) with an RI detector and using polystyrene as the standard, with the molecular weight being expressed on the basis of polystyrene.

When it is desired for the ARC to have a higher etching selectivity ratio relative to an organic resist film, the silicon-containing polymer should preferably have a less aromatic ring content in side chain, more preferably nil aromatic ring content. A noticeable antireflective effect is achieved only by the light absorbing capacity attributable to Si—Si bonds when the starting silane compounds are selected such that the silicon-containing polymer satisfies the relationship: $0.05 \leq M/(L+M+N) \leq 0.14$ wherein L is the number of Si—O bonds, M is the number of Si—Si bonds, and N is the number of Si—C bonds within the polymer. If $M/(L+M+N)<0.05$, no sufficient antireflective effect is achieved because the polymer contains less Si—Si bonds which are light absorbing groups. A polymer prepared solely from compounds of formula (1) has a $M/(L+M+N)$ value of 0.14.

Since the silane compound (1) is a dominant structure for absorbing light with a wavelength of up to 200 nm, a certain amount of the silane compound (1) must be used when co-hydrolytic condensation with the silane compound (2) or other silane compounds is carried out. Although the mixing ratio of the disilane compound (1) to the monosilane compound (2) varies with the identity of R and A, it is generally preferred to use at least 10 mol %, based on the total moles of hydrolyzable silane compounds, of the silane compound (1). When the silane compound (1) is added in an amount of at least 30 mol % based on the total moles of hydrolyzable silane compounds, an antireflective coating can be formed substantially without resorting to an organic light absorbing skeleton such as an aromatic ring.

When it is desired to enhance the light absorbing capacity at a given film thickness, it is possible to incorporate a substituent group having an aromatic skeleton with a high light absorbing capacity into R and A. Especially for the ArF exposure, by incorporating a benzene skeleton such as a phenyl or hydroxyphenyl group rather than an anthracene skeleton, the polymer can be provided with a light absorbing capacity without reducing the rate of dry etching with a fluorine gas plasma. As a general rule, however, the etching rate is reduced when any of aromatic rings is used. It is thus preferred to incorporate an aromatic ring in an amount as small as possible. Preferably the aromatic ring-bearing side chain to be incorporated in R and A is equal to or less than 10 mol %, more preferably equal to or less than 5 mol % of the entire R and A. As described above, the aromatic ring-bearing side chain may be omitted depending on the constitutional proportion of the silane compound (1).

The silicon-containing polymer has a silicon content which is determined by the selection and mixing ratio of the silane compounds (1) and (2). The silicon content of the silicon-containing polymer is defined as follows. In the case of a hydrolyzable silicon-containing monomer of formula (1), complete hydrolysis in the presence of sufficient water proceeds according to the scheme below.

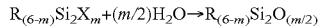

Provided that Rw is the formula weight of R, the silicon-containing polymer has a silicon containing proportion $S_1$ (%) which is:

$$S_1 = [28.1 \times 2 / \{Rw \times (6-m) + 28.1 \times 2 + 16 \times (m/2)\}] \times 100.$$

Similarly, in the case of a silicon-containing monomer of formula (2), the reaction is according to the scheme below.

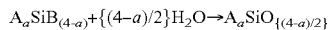

Provided that Aw is the formula weight of A, the silicon-containing polymer has a silicon containing proportion $S_2$ (%) which is:

$$S_2 = [28.1 / \{Aw \times a + 28.1 + 16 \times (4-a)/2\}] \times 100.$$

From the molar ratios of the respective compounds, the silicon containing proportion of the overall polymer can be calculated.

When the silicon content as calculated from the silane compounds (1) and (2) is equal to or more than 15% by weight, the resulting polymer exhibits high etching resistance to dry etching with an oxygen gas plasma or hydrogen/nitrogen gas plasma, as opposed to the case of a fluorine gas plasma. Then the ARC of the invention can be used as an etching mask when the underlying layer is an organic film. A silicon content equal to or more than 30% by weight ensures that when the ARC of the invention is used as an etching mask during processing of the underlying layer, the underlying layer can be processed even at an ARC thickness of equal to or less than 100 nm. This allows the overlying resist film to be thinner, that is, a substrate can be processed using a resist film having a thickness of about 150 to 250 nm. A silicon content equal to or more than 40% by weight ensures that the underlying layer can be etched even at an ARC thickness of equal to or less than 50 nm, and in this case, a resist film may have a thickness of about 100 to 200 nm.

In co-hydrolytic condensation of silane compounds to produce a siloxane polymer, the amount of water used is preferably 0.02 to 10 moles per mole of the monomers. A catalyst may be used to promote hydrolytic condensation. Suitable catalysts include acids such as formic acid, acetic acid, propionic acid, oleic acid, stearic acid, linoleic acid, salicylic acid, benzoic acid, oxalic acid, malonic acid, phthalic acid, fumaric acid, citric acid, tartaric acid, hydrochloric acid, sulfuric acid, nitric acid, sulfonic acid, methylsulfonic acid, tosylic acid, and trifluoromethanesulfonic acid; and metal chelates such as tetraalkoxytitanium, trialkoxymono(acetylacetonato)titanium, tetraalkoxyzirconium, trialkoxymono(acetylacetonato)zirconium, and aluminum triacetylacetonate.

In one reaction procedure, the monomer(s) is dissolved in an organic solvent, and water is added thereto whereupon hydrolytic reaction occurs. The catalyst may be added to the water or previously to the organic solvent. The reaction temperature is 0° C. to 100° C., preferably 10° C. to 80° C. The preferred procedure involves heating to 10 to 50° C. during dropwise addition of water, and thereafter, heating to 20 to 80° C. for the system to mature. Examples of suitable organic solvents used herein include methanol, ethanol, 1-propanol, 2-propanol, 1-butanol, 2-butanol, 2-methyl-1-propanol, acetone, tetrahydrofuran, toluene, hexane, ethyl acetate, cyclohexane, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures thereof.

Thereafter, the catalyst in the reaction solution is neutralized, and the organic solvent layer is separated and dehydrated. Thorough water removal is necessary because any residual water can induce condensation reaction of residual silanol. Water removal is preferably carried out by adsorption using salts such as magnesium sulfate or molecular sieves or by azeotropic water removal simultaneous with solvent removal.

In another reaction procedure, water and the catalyst are dissolved in an organic solvent, and the monomer(s) is added thereto. At this point, the monomer may have been diluted with the organic solvent. The reaction temperature is 0° C. to 100° C., preferably 10° C. to 80° C. The preferred procedure involves heating to 10 to 50° C. during dropwise addition of water, and thereafter, heating to 20 to 80° C. for the system to mature. The preferred organic solvents used herein are water-soluble solvents, for example, methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, and propylene glycol monopropyl ether, and mixtures thereof.

Thereafter, another organic solvent which is insoluble or substantially insoluble in water is added to the reaction solution, and the organic solvent layer is separated and washed with water for removing the catalyst used for hydrolytic condensation. At this point, neutralization may be done, if necessary. Subsequently, the organic solvent layer separated is dehydrated. Thorough water removal is necessary because any residual water can induce condensation reaction of residual silanol. Water removal is preferably carried out by adsorption using salts such as magnesium sulfate or molecular sieves or by azeotropic water removal simultaneous with solvent removal.

In the composition comprising the silicon-containing polymer according to the invention, modifiers and organic solvents may be incorporated. Suitable modifiers which can be used herein include acid generators, crosslinkers, surfactants, stabilizers, and the like.

Acid generators may be added for promoting thermally induced crosslinking reaction. The acid generators include thermal acid generators capable of generating an acid through pyrolysis and photoacid generators capable of generating an acid upon exposure to light, and both are useful.

The acid generators used herein include
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4), (v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium salts of formula (P1a-1), (P1a-2) or (P1a-3):

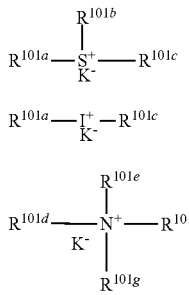

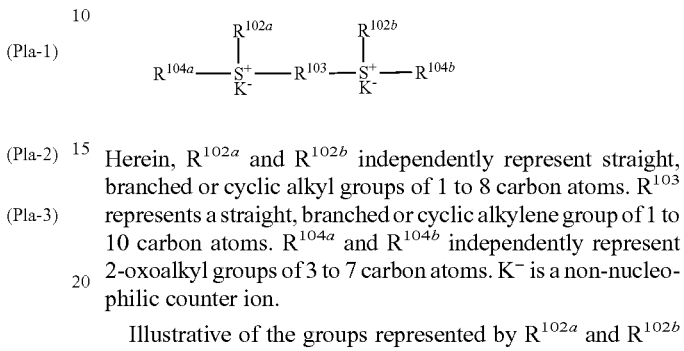

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

The salts of (P1a-1) and (P1a-2) have both the functions of a photoacid generator and a thermal acid generator while the salts of (P1a-3) function as a thermal acid generator.

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane derivatives of formula (P2)

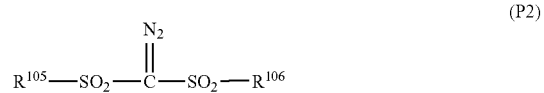

Herein, $R^{105}$ and $R^{106}$ independently represent straight, branched or cyclic alkyl or halogenated alkyl groups of 1 to 12 carbon atoms, substituted or unsubstituted aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

$$R^{107}-SO_2-O-N=\underset{R^{108}}{\overset{|}{C}}-\underset{R^{109}}{\overset{|}{C}}=N-O-SO_2-R^{107}$$
(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone derivatives of formula (P4)

$$R^{101a}-\overset{O}{\underset{O}{\overset{\|}{S}}}-CH_2-\overset{O}{\underset{O}{\overset{\|}{S}}}-R^{101b}$$
(P4)

Herein, $R^{101a}$ and $R^{101b}$ are as defined above.

(v) Sulfonic acid esters of N-hydroxyimide compounds of formula (P5)

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
tetra-n-butylammonium nonafluorobutanesulfonate,
tetraphenylammonium nonafluorobutanesulfonate,
tetramethylammonium p-toluenesulfonate,
(p-methoxybenzyl)dimethylphenylammonium trifluoromethane-sulfonate,
(p-methoxybenzyl)trimethylammonium trifluoromethane-sulfonate,
diphenyliodonium trifluoromethanesulfonate,
(p-tert-butoxyphenyl)phenyliodonium trifluoromethane-sulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethane-sulfonate,
bis(p-tert-butoxyphenyl)phenylsulfonium trifluoromethane-sulfonate,
tris(p-tert-butoxyphenyl)sulfonium trifluoromethane-sulfonate,
triphenylsulfonium p-toluenesulfonate,
(p-tert-butoxyphenyl)diphenylsulfonium p-toluene-sulfonate,
bis(p-tert-butoxyphenyl)phenylsulfonium p-toluene-sulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluene-sulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocyclohexyl)sulfonium trifluoromethanesulfonate, ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfonic acid derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethane-sulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate, N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. The acid generator is preferably added in an amount of 0.01 to 50 parts by weight, and especially 0.1 to 40 parts by weight, per 100 parts by weight of the base polymer. The addition of the acid generator establishes a certain crosslinking density, which is advantageous because sufficient bonds must be formed between siloxane polymers in order to prevent intermixing when a resist composition solution or any coating solution is coated following the film formation using the inventive composition.

A crosslinker can be used herein as one of the modifiers. The crosslinker is a compound capable of crosslinking with a polymer under the action of an acid. Suitable crosslinkers include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Where epoxy groups are included as the substituent groups on R or A, the addition of a compound having a hydroxyl group is effective for increasing reactivity with epoxy groups and improving crosslinking efficiency. Compounds having at least two hydroxyl groups in a molecule are more preferred.

Examples include
alcoholic group-containing compounds such as 4,8-bis(hydroxymethyl)tricyclo[5.2.1.0$^{2,6}$]-decane, pentaerythritol, 1,2,6-hexanetriol,
4,4',4"n-methylidene triscyclohexanol,
4,4'-[1-[4-[1-(4-hydroxycyclohexyl)-1-methylethyl]phenyl]-ethylidene]biscyclohexanol,
[1,1'-bicyclohexyl]-4,4'-diol, methylenebiscyclohexanol, decahydronaphthalene-2,6-diol, and
[1,1'-bicyclohexyl]-3,3',4,4'-tetrahydroxyl; and
low-nuclear phenol compounds such as bisphenol, methylene bisphenol, 2,2'-methylenebis[4-methylphenol],
4,4'-methylidene-bis[2,6-dimethylphenol],
4,4'-(1-methyl-ethylidene)bis[2-methylphenol],
4,4'-cyclohexylidene bisphenol,
4,4'-(1,3-dimethylbutylidene)bisphenol,
4,4'-(1-methylethylidene)bis[2,6-dimethylphenol],
4,4'-oxybisphenol, 4,4'-methylenebisphenol,
bis(4-hydroxyphenyl)methanone,
4,4'-methylene bis[2-methylphenol],
4,4'-[1,4-phenylenebis(1-methylethylidene)]bisphenol,
4,4'-(1,2-ethanediyl)bisphenol,
4,4'-(diethylsilylene)bisphenol,
4,4'-[2,2,2-trifluoro-1-(trifluoromethyl)ethylidene]bisphenol,
4,4',4"n-methylidene trisphenol,
4,4'-[1-(4-hydroxyphenyl)-1-methylethyl]phenyl]ethylidene]-bisphenol,
2,6-bis[(2-hydroxy-5-methylphenyl)methyl]-4-methylphenol,
4,4',4"-ethylidyne tris[2-methylphenol],
4,4',4"-ethylidyne trisphenol,
4,6-bis[(4-hydroxyphenyl)methyl]-1,3-benzenediol,
4,4'-[(3,4-dihydroxyphenyl)methylene]bis[2-methylphenol],
4,4',4",4'''-(1,2-ethanediylidene)tetrakisphenol,
4,4',4",4'''-(1,2-ethanediylidene)tetrakis[2-methylphenol],
2,2'-methylenebis[6-[(2-hydroxy-5-methylphenyl)methyl]-4-methylphenol],
4,4',4",4'''-(1,4-phenylenedimethylidyne)tetrakisphenol,
2,4,6-tris(4-hydroxyphenylmethyl)-1,3-benzenediol,
2,4',4"-methylidenetrisphenol,
4,4',4'''-(3-methyl-1-propanyl-3-ylidene)trisphenol,
2,6-bis[(4-hydroxy-3-fluorophenyl)methyl]-4-fluorophenol,
3,6-bis[(3,5-dimethyl-4-hydroxyphenyl)methyl]-1,2-benzenediol,
4,6-bis[(3,5-dimethyl-4-hydroxyphenyl)methyl]-1,3-benzenediol,
p-methylcalix[4]arene,
2,2'-methylenebis[6-[(2,5/3,6-dimethyl-4/2-hydroxyphenyl)-methyl]-4-methylphenol,
2,2'-methylenebis[6-[(3,5-dimethyl-4-hydroxyphenyl)methyl]-4-methylphenol,
4,4',4",4'''-tetrakis[(1-methylethylidene)bis(1,4-cyclohexylidene)]phenol,
6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

Where hydroxyl groups are included in R or A, the addition of a compound having an epoxy group is effective for increasing reactivity with hydroxyl groups and improving crosslinking efficiency. Compounds having at least two epoxy groups in a molecule are more preferred. Examples include
tris(2,3-epoxypropyl)isocyanurate,
trimethylolmethane triglycidyl ether,
trimethylol propane triglycidyl ether, and
triethylol ethane triglycidyl ether.

In the inventive composition, the crosslinker, which may be either a hydroxyl- or epoxy-containing compound, is preferably compounded in an amount of 0.1 to 50 parts by weight, more preferably 1 to 20 parts by weight per 100 parts by weight of the base polymer. Less than 0.1 pbw of the crosslinker may cause insufficient crosslinkage and undercure to the polymer, allowing for mixing with the overcoat resist film. More than 50 pbw of the crosslinker may degrade the antireflection effect or allow the crosslinked film to crack, and reduce the silicon content of the overall film, which thus has poor etching resistance.

If necessary, a surfactant may be incorporated as the modifier. The preferred surfactants are nonionic surfactants including perfluoroalkylpolyoxyethylene ethanols, fluorinated alkyl esters, perfluoroalkylamine oxides, perfluoroalkyl ethylene oxide adducts, and fluorinated organosiloxanes. They are commercially available under the trade name of Fluorad FC-430, FC-431 and FC-4430 (Sumitomo 3M Co., Ltd.), Surflon S-141, S-145, KH-10, KH-20, KH-30 and KH-40 (Asahi Glass Co., Ltd.), Unidyne DS-401, DS-403 and DS-451 (Daikin Industry Co., Ltd.), Megaface F-8151 (Dainippon Ink & Chemicals, Inc.), X-70-092 and X-70-093 (Shin-Etsu Chemical Co., Ltd.). Inter alia, Fluorad FC-4430, KH-20, KH-30, and X-70-093 are preferred.

If necessary, a stabilizer may also be incorporated as the modifier. The stabilizer is added for restraining the film of the composition from changing its thickness during shelf storage. Examples of suitable stabilizers include carboxylic acids and carboxylic acid anhydrides such as oxalic acid, malonic acid, malonic anhydride, maleic acid, maleic anhydride, fumaric acid, citraconic acid, glutaric acid, glutaric anhydride, and adipic acid.

It is also possible to add a solvent to the composition as the stabilizer, the solvent having a function of improving the stability of the composition. The solvent should have at least one ether bond, carbonyl bond and/or ester bond and at least one hydroxyl group in a molecule and be capable of dissolving the acid generator and other additives therein. Suitable organic solvents include
2-methoxyethanol, 2-ethoxyethanol, 2-propoxyethanol,
2-isopropoxyethanol, 2-butoxyethanol,
2-(cyclohexyloxy)ethanol, propylene glycol butyl ether,
1-tert-butyl-2-propanol, 3-ethoxy-1-propanol,
propylene glycol propyl ether,
di(propylene glycol)-tert-butyl ether, 3-methoxy-1-butanol,
3-methoxy-3-methyl-1-butanol, 1-methoxy-2-propanol,
3-methoxy-1,2-propane diol, 3-ethoxy-1,2-propane diol,
3-allyloxy-1,2-propane diol, di(ethylene glycol),
di(propylene glycol), di(ethylene glycol) monomethyl ether,
di(ethylene glycol) monoethyl ether,
di(ethylene glycol) monobutyl ether,
di(ethylene glycol) monopropyl ether,
di(propylene glycol) monomethyl ether,
di(propylene glycol) monoethyl ether,
di(propylene glycol) monobutyl ether,
di(propylene glycol) monopropyl ether,
ethylene glycol monoacetate, methyl glycolate,
ethyl glycolate, methyl lactate, ethyl lactate,
propyl lactate, butyl lactate, isobutyl lactate,
tert-butyl lactate, methyl 2-hydroxybutanoate,
ethyl 2-hydroxybutanoate, propyl 2-hydroxybutanoate,
butyl 2-hydroxybutanoate, isobutyl 2-hydroxybutanoate,
tert-butyl 2-hydroxybutanoate, methyl 3-hydroxybutanoate,
ethyl 3-hydroxybutanoate, propyl 3-hydroxybutanoate,
butyl 3-hydroxybutanoate, isobutyl 3-hydroxybutanoate,
tert-butyl 3-hydroxybutanoate, hydroxyacetone,
1-hydroxy-2-butanone, 3-hydroxy-2-butanone,
3-hydroxy-3-methyl-2-butanone, 4-hydroxy-3-methyl-2-butanone,
3-acetyl-1-propanol, and 4-hydroxy-4-methyl-2-pentanone.
They may be used alone or in admixture of two or more.

In the composition of the invention, an organic solvent may be used. Any organic solvent is useful as long as the siloxane polymer according to the invention and modifiers are soluble therein. Suitable organic solvents include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as
propylene glycol monomethyl ether,
ethylene glycol monomethyl ether,
propylene glycol monoethyl ether,
ethylene glycol monoethyl ether,
propylene glycol dimethyl ether, and
diethylene glycol dimethyl ether; esters such as
propylene glycol monomethyl ether acetate,
propylene glycol monoethyl ether acetate, ethyl lactate,
ethyl pyruvate, butyl acetate, methyl 3-methoxypropionate,
ethyl 3-ethoxypropionate, tert-butyl acetate,
tert-butyl propionate, and
propylene glycol mono-tert-butyl ether acetate; and lactones such as γ-butyrolactone. These solvents may be used alone or in combinations of two or more thereof. It is understood that the solvents listed above as the stabilizer may also be used as the solvent as long as the siloxane polymer according to the invention and modifiers are soluble therein.

Of the above organic solvents, preferred are diethylene glycol dimethyl ether, propylene glycol monomethyl ether, propylene glycol monoethyl ether, propylene glycol monopropyl ether, propylene glycol monomethyl ether acetate, butyl acetate, ethyl lactate, cyclohexanone, and γ-butyrolactone, and mixtures thereof.

The organic solvent is preferably added in an amount of about 400 to 100,000 parts by weight, especially about 500 to 50,000 parts by weight per 100 parts by weight of the base polymer.

The silicon-containing ARC forming composition of the invention can be applied onto a patternable substrate by any desired technique such as spin coating, to form a silicon-containing ARC thereon. After spin coating, the coating is desirably baked in order to evaporate off the solvent and to promote crosslinking reaction for preventing the film from mixing with the overlying resist film. The baking is preferably effected at a temperature of 50 to 400° C. for a time of 10 to 300 seconds.

The silicon-containing ARC forming composition of the invention is used for processing of a patternable substrate. Examples of the patternable substrate include a low-k dielectric film having a dielectric constant (k) of up to 3, a primarily processed low-k dielectric film, a nitrogen and/or oxygen-containing inorganic film, and a metal film.

Where the silicon-containing ARC of the invention is used in the exposure process with ArF excimer laser light, the overlying resist film may be any of ordinary ArF excimer laser lithography resist compositions. There are known a number of candidates for the ArF excimer laser lithography resist composition, including resist compositions of the positive working type primarily comprising a polymer which becomes soluble in an alkaline aqueous solution as a result of decomposition of acid labile groups under the action of an acid, a photoacid generator, and a basic compound for controlling acid diffusion; and resist compositions of the negative working type primarily comprising a polymer which becomes insoluble in an alkaline aqueous solution as a result of reaction with a crosslinker under the action of an acid, a photoacid generator, a crosslinker, and a basic compound for controlling acid diffusion. Properties of a resist composition differ depending on what type of polymer is used. Well-known polymers are generally classified into poly(meth) acrylic, cycloolefin/maleic anhydride (COMA) copolymer, COMA-(meth)acrylic hybrid, cycloolefin ring-opening metathesis polymers (ROMP), and polynorbornene systems. Of these, a resist composition comprising a poly(meth)acrylic polymer has superior resolution to other polymers because etching resistance is achieved by introducing an alicyclic skeleton into side chain.

As discussed above, the ArF excimer laser lithography positive photoresist composition comprising a (meth)acrylate polymer is very useful in forming a pattern requiring a high resolution. However, there is a possibility that etching resistance is locally short, as discussed above. To enhance the lithography reliability, it is effective to select a material that can be etched without imposing a substantial load to the resist film. The combination of the ARC of the invention with the resist film is then successful in improving the reliability during etching while maintaining a high resolution.

There are known a number of ArF excimer laser lithography resist compositions comprising poly(meth)acrylic polymers. For the positive type, a polymer is composed of a combination of units for providing the main function of etching resistance, units which turn to be alkali soluble as a result of decomposition under the action of an acid, and units for providing adhesion, or in some cases, a combination comprising one unit capable of providing two or more of the above-mentioned functions. As the unit which changes alkali solubility under the action of an acid, (meth)acrylic acid esters having an acid labile group with an adamantane skeleton (see JP-A 9-73173) and (meth)acrylic acid esters having an acid labile group with a norbornane or tetracyclododecane skeleton (see JP-A 2003-84438) are advantageously used because they provide high resolution and etching resistance. As the unit which ensures adhesion, (meth)acrylic acid esters having a norbornane side chain with a lactone ring (see WO 00/01684), (meth)acrylic acid esters having an oxanorbornane side chain (see JP-A 2000-159758), and (meth) acrylic acid esters having a hydroxyadamantyl side chain (see JP-A 8-12626) are advantageously used because they provide satisfactory etching resistance and high resolution.

Further, a polymer comprising units having as a functional group an alcohol which exhibits acidity by fluorine substitution on the adjacent carbon (see Polym. Mater. Sci. Eng., 1997, 77, pp449) draws attention as a resist polymer complying with the immersion lithography of the current great interest because the units impart anti-swelling physical properties and hence, high resolution to the polymer. However, a decline of etching resistance due to inclusion of fluorine within the polymer is a problem. The ARC of the invention is advantageously used in combination with such an organic resist material which is relatively difficult to secure etching resistance.

In the ArF excimer laser lithography resist compositions comprising the above-described polymers, acid generators, basic compounds and other components are also included. The acid generators used herein may be substantially the same as those used in the silicon-containing film forming composition of the invention, with onium salts being especially preferred for sensitivity and resolution. Also a number of basic compounds are known, and a choice may be advantageously made among the basic compounds described in JP-A 2005-146252 (US 20050016499A, EP 200517784A), for example.

After the silicon-containing film (ARC) is formed, a photoresist layer is formed thereon using a photoresist composition solution. Like the silicon-containing film, the photoresist composition solution is preferably applied by spin coating. Once the resist composition is spin coated, it is prebaked, preferably at 80 to 180° C. for 10 to 300 seconds. The coating is then exposed, followed by post-exposure bake (PEB) and development, yielding a resist pattern. It is preferred that the ARC of the invention have a thickness equal to or less than 200 nm, and the photoresist film have a thickness equal to or less than 300 nm.

The silicon-containing film (ARC) is etched using a fluorocarbon gas, nitrogen gas, carbon dioxide gas or the like. With these gases, the silicon-containing film (ARC) is etched at so high an etching rate that the overlying resist film undergoes less slimming.

The substrate processing intermediate comprising the ARC according to the invention is applicable to all prior art embodiments where ARC is combined with organic resist films.

In all of the case where an ARC is singly applied between a patternable substrate and a resist film, the case where an inorganic film without an antireflective function such as $SiO_2$ film is interposed as an inorganic hard mask between a substrate and a resist film, and the case where an inorganic film with an antireflective function such as SiN or SiON film is used, if it is desired to use an inorganic film with a reduced thickness, the combined use of the ARC of the invention enables to reduce the load applied to the resist film during etching. One example is the case where it is desired to process a patternable substrate by chlorine dry etching. As compared with fluorine dry etching, the chlorine dry etching tends to apply a load to the organic resist film, while inorganic $SiO_2$, SiN, and SiON films having a fully high degree of oxidation have relatively high dry etching resistance. It is well known that these silicon-containing inorganic films can be used as hard masks because they are fluorine dry etchable. Then in the case where an ARC is used on a silicon-containing inorganic film, the ARC of the invention which is expected to undergo fluorine dry etching at a high rate can be advantageously used, as compared with the prior art type ARC containing a high level of aromatic rings. It is noted that the inorganic film preferably has a thickness equal to or less than 100 nm.

In the case where such an inorganic hard mask is used, or specifically the case where an aromatic polymer-containing organic film is used between a patternable substrate and an inorganic film, especially the trilayer resist process, the ARC of the invention is advantageously used as the ARC on the inorganic film. With respect to the trilayer resist process, a number of references are known, for example, JP-A 2004-153125.

Where a substrate having steps is processed using a resist composition, a planarizing film is formed on the substrate to provide a planar surface before processing with the resist composition. Such a process, especially the dual damascene process, entails a problem that a load is applied to the resist film during etching. By using the silicon-containing polymer to form a planarizing film, an etching selectivity ratio can be established between the resist film and the planarizing film. In such a case, the ARC of the invention is advantageously used.

The above-described processes are already disclosed by a number of references including JP-A 2004-349572. It is apparent to those skilled in the art that the ARC of the invention is essentially applicable to any well-known processes by virtue of its advantage that it exhibits an etching selectivity due to a high silicon content.

EXAMPLE

Synthesis Examples and Examples are given below together with Comparative Examples for further illustrating the invention although the invention is not limited thereby.

Synthesis Example 1

A 300-ml glass flask was charged with a mixture of 27 g of tetraethoxydimethyldisilane and 23 g of triethoxytrimethyldisilane and 10 g of ethanol. With stirring, 15 g of 0.5N hydrochloric acid aqueous solution was slowly added at room temperature. Agitation continued for a further 2 hours. After the complete consumption of monomers was ascertained by GC and GPC, 350 g of propylene glycol monomethyl ether (PGME) was added. The liquid mixture was subjected to solvent exchange under a reduced pressure while heating the liquid at 40° C. There was obtained a PGME solution of Polymer 1. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 1 are summarized in Table 1.

Synthesis Example 2

A 300-ml glass flask was charged with 27 g of tetraethoxydimethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N acetic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There was obtained an EL solution of Polymer 2. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 2 are summarized in Table 1.

Synthesis Example 3

A 300-ml glass flask was charged with 27 g of tetraethoxydimethyldisilane, 23 g of triethoxytrimethyldisilane, 14 g of methyltrimethoxysilane, 48 g of 2-(3,4-epoxycyclohexyl)ethyltrimethoxysilane, and 75 g of ethanol. With stirring, 50 g of 0.5N oxalic acid aqueous solution was slowly added at room temperature. Agitation continued for a further 2 hours. After the complete consumption of monomers was ascertained by GC and GPC, 600 g of γ-butyrolactone (GBL) was added. The liquid mixture was subjected to solvent exchange under a reduced pressure while heating the liquid at 40° C. There was obtained a GBL solution of Polymer 3. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 3 are summarized in Table 1.

Synthesis Example 4

A 300-ml glass flask was charged with 53 g of tetraethoxydimethyldisilane and 10 g of ethanol. With stirring, 15 g of 0.5N hydrochloric acid aqueous solution was slowly added at room temperature. Agitation continued for a further 2 hours. After the complete consumption of monomer was ascertained by GC and GPC, 350 g of propylene glycol monomethyl ether (PGME) was added. The liquid mixture was subjected to solvent exchange under a reduced pressure while heating the liquid at 40° C. There was obtained a PGME solution of Polymer 4. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 4 are summarized in Table 1.

Synthesis Examples 5 to 9

A 300-ml glass flask was charged with 12, 17, 27, 37 or 41 g of tetraethoxydimethyldisilane, 42, 35, 24, 14 or 9 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N oxalic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There were obtained EL solutions of Polymers 5 to 9. The yield of each polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymers 5 to 9 are summarized in Table 1.

Synthesis Example 10

A 300-ml glass flask was charged with 30 g of pentaethoxymethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N acetic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There was obtained an EL solution of Polymer 10. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 10 are summarized in Table 1.

Synthesis Example 11

A 300-ml glass flask was charged with 42 g of tetraethoxysilane, 4 g of trimethoxyphenylsilane, and 10 g of ethanol. With stirring, 25 g of 0.5N nitric acid aqueous solution was slowly added at room temperature. Agitation continued for a further 2 hours. After the complete consumption of monomers was ascertained by GC and GPC, 350 g of PGME was added. The liquid mixture was subjected to solvent exchange under a reduced pressure while heating the liquid at 40° C. There was obtained a PGME solution of Polymer 11. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 11 are summarized in Table 1.

Synthesis Example 12

A 300-ml glass flask was charged with 42 g of tetraethoxysilane, 13 g of 9-anthracenecarboxymethyl-triethoxysilane, and 20 g of methanol. With stirring, 25 g of 0.5N hydrochloric acid aqueous solution was slowly added at room temperature. Agitation continued for a further 2 hours. After the complete consumption of monomers was ascertained by GC and GPC, 350 g of PGME was added. The liquid mixture was subjected to solvent exchange under a reduced pressure while heating the liquid at 40° C. There was obtained a PGME solution of Polymer 12. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 12 are summarized in Table 1.

Synthesis Example 13

A 300-ml glass flask was charged with 27 g of tetraethoxydimethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 60 g of 0.5N methanesulfonic acid aqueous solution was slowly added at room temperature. Agitation continued for a further 20 hours. After the complete consumption of monomers was ascertained by GC and GPC, the liquid mixture was heated at 40° C. under vacuum, thereby distilling off the solvent. 350 g of PGME was added to the resulting polymer (Polymer 13) for fully dissolving the polymer. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and M/(L+M+N) in the polymer were determined from the charge composition. Data of Polymer 13 are summarized in Table 1.

TABLE 1

| Polymer | Mw | Proportion of Mw < 500 (wt %) | Si content (wt %) | L/(L + M + N) | m = 3 | m = 4 | m = 5 |
|---|---|---|---|---|---|---|---|
| Polymer 1  | 3,200  | 1  | 46 | 0.14 | 5 | 5  | 0 |
| Polymer 2  | 2,100  | 2  | 42 | 0.10 | 5 | 5  | 0 |
| Polymer 3  | 2,500  | 2  | 32 | 0.07 | 5 | 5  | 0 |
| Polymer 4  | 3,000  | 1  | 48 | 0.14 | 0 | 10 | 0 |
| Polymer 5  | 2,600  | 1  | 42 | 0.11 | 2 | 8  | 0 |
| Polymer 6  | 2,600  | 2  | 42 | 0.11 | 3 | 7  | 0 |
| Polymer 7  | 2,600  | 1  | 42 | 0.10 | 5 | 5  | 0 |
| Polymer 8  | 2,600  | 1  | 42 | 0.10 | 7 | 3  | 0 |
| Polymer 9  | 2,600  | 2  | 42 | 0.10 | 8 | 2  | 0 |
| Polymer 10 | 2,650  | 2  | 43 | 0.10 | 5 | 0  | 5 |
| Polymer 11 | 800    | 15 | 42 | 0    | 0 | 0  | 0 |
| Polymer 12 | 2,000  | 2  | 31 | 0    | 0 | 0  | 0 |
| Polymer 13 | 21,000 | 0  | 42 | 0.10 | 5 | 5  | 0 |

Examples and Comparative Examples

Antireflective silicon-containing film forming solutions were prepared by dissolving a polymer (Polymers 1 to 13), an acid generator (AG1), and a crosslinker (CL1) in a solvent containing 0.1 wt % of Fluorad FC-430 (3M-Sumitomo Co., Ltd.) according to the formulation shown in Table 2, and passing through a fluoroplastic filter having a pore size of 0.1 µm. These solutions are designated Solutions #1 to #13.

Each of the silicon-containing film forming solutions was coated on a silicon substrate and baked at 250° C. for 60 seconds to form a silicon-containing antireflective film of 193 nm thick. The resulting films are designated Films #1 to #13. Using a variable angle spectroscopic ellipsometer (VASE®) of J. A. Woollam Co., the optical constants (refractive index n, extinction coefficient k) at wavelength 193 nm of Films #1 to #13 were determined. The results are also shown in Table 2.

TABLE 2

Composition and optical constants of ARC silicon-containing film

| No. | Polymer (pbw) | Acid generator (pbw) | Crosslinker (pbw) | Solvent (pbw) | Optical constants at wavelength 193 nm | |
|---|---|---|---|---|---|---|
| | | | | | n | k |
| Solution #1 | Polymer 1 (4.0) | AG1 (0.04) | — | PGME (100) | 1.68 | 0.20 |
| Solution #2 | Polymer 2 (4.0) | AG1 (0.04) | CL1 (0.1) | EL (100) | 1.67 | 0.21 |
| Solution #3 | Polymer 3 (4.0) | AG1 (0.04) | — | GBL (100) | 1.67 | 0.20 |
| Solution #4 | Polymer 4 (4.0) | AG1 (0.04) | — | PGME (100) | 1.68 | 0.20 |
| Solution #5 | Polymer 5 (4.0) | AG1 (0.04) | — | PGME (100) | 1.67 | 0.20 |
| Solution #6 | Polymer 6 (4.0) | AG1 (0.04) | — | PGME (100) | 1.67 | 0.20 |
| Solution #7 | Polymer 7 (4.0) | AG1 (0.04) | — | PGME (100) | 1.67 | 0.20 |
| Solution #8 | Polymer 8 (4.0) | AG1 (0.04) | — | PGME (100) | 1.67 | 0.20 |
| Solution #9 | Polymer 9 (4.0) | AG1 (0.04) | — | PGME (100) | 1.67 | 0.20 |
| Solution #10 | Polymer 10 (4.0) | AG1 (0.04) | CL1 (0.1) | PGME (100) | 1.67 | 0.19 |
| Solution #11 | Polymer 11 (4.0) | AG1 (0.04) | — | PGME (100) | 1.70 | 0.20 |
| Solution #12 | Polymer 12 (4.0) | AG1 (0.04) | — | PGME (100) | 1.75 | 0.25 |
| Solution #13 | Polymer 13 (4.0) | AG1 (0.04) | — | PGME (100) | 1.66 | 0.19 |

AG1: di(4-t-butylphenyl)iodonium perfluorobutanesulfonate
CL1: Celloxide 2021 (Daicel Chemical Industries, Ltd.)
PGME: propylene glycol monomethyl ether
EL: ethyl lactate
GBL: γ-butyrolactone First, an undercoat-forming material, for example, a composition containing 28 parts by weight of a resin in the form of 4,4'-(9H-fluoren-9-ylidene)bisphenol novolac resin with a molecular weight of 11,000 and 100 parts by weight of a solvent (see JP-A 2005-128509) was spin coated onto a patternable substrate and baked at 200° C. for one minute to form an undercoat organic film of 300 nm thick. A number of resins including the above-specified resin and other novolac resins are known as the undercoat organic film material for the multilayer resist process, and any of them can be used herein.

Next, each of the silicon-containing film forming solutions (Solutions #1 to #13) was spin coated and baked at 270° C. for 60 seconds to form an intermediate layer of 100 nm thick.

Further, to form an overcoat resist film, a resist composition for ArF excimer laser lithography was prepared by dissolving 10 parts by weight of a resin, identified below, 0.2 part by weight of triphenylsulfonium nonafluorobutane-sulfonate as a photoacid generator and 0.02 part by weight of triethanolamine as a basic compound in propylene glycol monomethyl ether acetate (PGMEA) containing 0.1 wt % of Fluorad FC-430 (3M-Sumitomo Co., Ltd.) and passing through a fluoroplastic filter having a pore size of 0.1 μm.

Polymer:

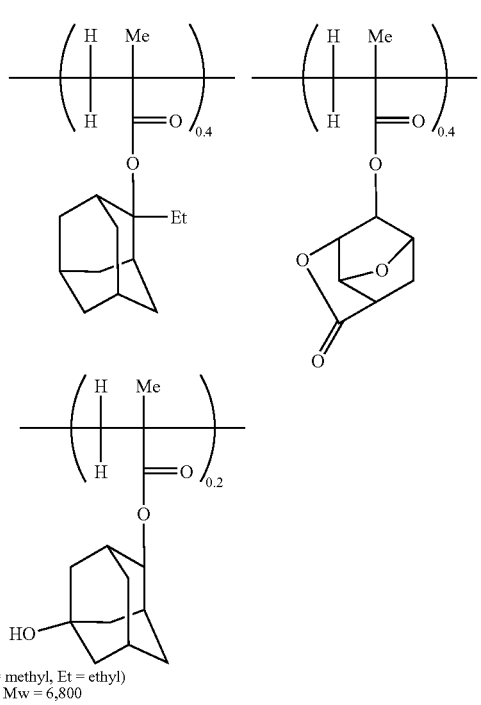

(Me = methyl, Et = ethyl)
Mw = 6,800

The resist composition was coated onto the intermediate layer and baked at 130° C. for 60 seconds to form a photoresist layer of 200 nm thick.

Thereafter, the resist layer was exposed using an ArF laser stepper S305B (Nikon Corporation, NA 0.68, σ 0.85, 2/3 annular illumination, Cr mask), then baked (PEB) at 110° C. for 90 seconds, and developed with a 2.38 wt % aqueous solution of tetramethylammonium hydroxide (TMAH), thereby giving a positive pattern. The shape of the 90 nm line-and-space pattern was observed, inspecting substrate-proximate footing, undercut and intermixing phenomena. The results are shown in Table 3.

TABLE 3

Results of resist exposure (pattern profile)

| Film | 90 nm L/S pattern profile |
|---|---|
| Film #1 | perpendicular, no footing |
| Film #2 | perpendicular, no footing |
| Film #3 | perpendicular, no footing |
| Film #4 | perpendicular, no footing |
| Film #5 | slightly tapered, footing |
| Film #6 | perpendicular, slight footing |
| Film #7 | perpendicular, no footing |
| Film #8 | perpendicular, slight footing |
| Film #9 | slightly reverse tapered, footing |
| Film #10 | perpendicular, footing |
| Film #11 | slightly reverse tapered, footing |
| Film #12 | pattern collapse due to reverse tapering |
| Film #13 | much scum between patterns |

Since the intermediate films using the polymers according to the invention had a good resist compatibility, resist pattern profiles with rectangularity were obtained. In the case of intermediate films using comparative polymers, the profiles of overlying resist were unsatisfactory.

Furthermore, a shelf stability test was performed. The silicon-containing film forming compositions (Solutions #1-4, #10-12) prepared above were stored at 30° C. for one month, following which they were coated by the above-mentioned technique. It was examined whether any change of film formation occurred before and after the storage.

TABLE 4

Shelf stability test

| Composition | State as coated |
|---|---|
| Solution #1 | no striation, no thickness change |
| Solution #2 | no striation, no thickness change |
| Solution #3 | no striation, no thickness change |
| Solution #4 | striation, 5% thickness increase |
| Solution #10 | no striation, 3% thickness increase |
| Solution #11 | striation, 5% thickness increase |
| Solution #12 | striation, 5% thickness increase |

The preferred embodiments of the invention are described below.

1st Embodiment

The first embodiment of the invention is to use the composition of the invention as ARC in the single layer resist process.

The silicon-containing film forming composition (Solution #2) was spin coated onto a patternable substrate and baked at 250° C. for one minute to form an ARC of 100 nm thick.

A photoresist layer was formed on the ARC, specifically using an ArF excimer laser lithography resist composition. The resist composition was prepared by dissolving 10 parts by weight of a resin, identified below, 0.2 part by weight of triphenylsulfonium nonafluorobutane-sulfonate as a photoacid generator and 0.02 part by weight of triethanolamine as a basic compound in 600 parts by weight of propylene glycol monomethyl ether acetate (PGMEA).

Resin:

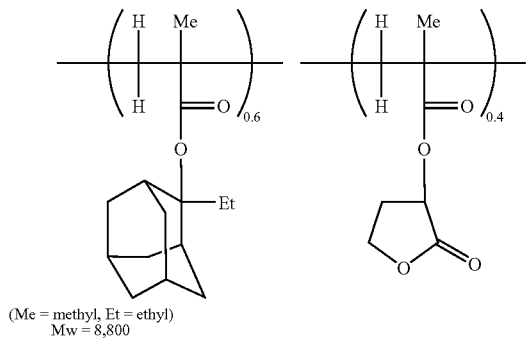

(Me = methyl, Et = ethyl)
Mw = 8,800

The resist composition was coated onto the ARC-bearing substrate and baked at 120° C. for 60 seconds to form a resist layer of 250 nm thick.

It is understood that as the resist composition used herein, any ordinary organic resist compositions excluding silicon-containing resist compositions may be applied in addition to the above. The resist composition may be either positive or negative, and either chemically amplified or not. In fact, the resist composition which is used in the pattern feature size processing with which the lithography process of the invention is advantageously used is a chemically amplified resist composition.

A number of chemically amplified resist compositions have been disclosed including those for KrF excimer laser lithography comprising aromatic skeleton resins and those for ArF excimer laser lithography comprising aliphatic polycyclic skeleton resins. In the pattern forming process of the invention, any known resist compositions may be used. In fact, ArF exposure is necessary in order to use the resist composition at a pattern rule equal to or less than 65 nm.

It is now described how to process the respective layers.

For the resist film, a standard processing procedure involves selection of a light source corresponding to the type of resist film, for example, KrF excimer laser, ArF excimer laser or $F_2$ laser light, imagewise light exposure, treatments selected for the type of resist film, and development, thereby forming a resist pattern. In the case of the above-specified resist film, it is exposed on an ArF laser stepper S305B (Nikon Corporation, NA 0.68, σ 0.85, 2/3 annular illumination, Cr mask), then baked (PEB) at 110° C. for 90 seconds, and developed with a 2.38 wt % aqueous solution of tetramethylammonium hydroxide (TMAH), thereby giving a 110-nm line-and-space pattern. On the resulting positive pattern, no defects like footing are observable.

In this example, the ARC of the invention has a thickness of 100 nm and the resist film has a thickness of 250 nm.

Next, an organic material is dry etched under conditions under which an etching rate of silicon oxide is dominantly high, while using the resist pattern as an etching mask. Specific dry etching is performed using a dry etching instrument TE-8500P by Tokyo Electron Ltd., and under conditions: a chamber pressure of 40 Pa, an RF power of 1,300 W, a gap of 9 mm, a $CHF_3$ gas flow rate of 30 ml/min, a $CF_4$ gas flow rate of 30 ml/min, and an Ar gas flow rate of 100 ml/min. By the dry etching under these conditions, the silicon-containing ARC can be processed while substantially eliminating the influence of pattern changes by side etching of the resist film.

2nd Embodiment

The second embodiment of the invention is to use silicon oxide as an inorganic silicon-containing film or intermediate film in the multilayer resist process.

First, for example, a composition containing 28 parts by weight of a resin in the form of 4,4'-(9H-fluoren-9-ylidene) bisphenol novolac resin with a molecular weight of 11,000 and 100 parts by weight of a solvent (see JP-A 2005-128509) is spin coated onto a patternable substrate and baked at 200° C. for one minute to form an undercoat organic film of 300 nm thick.

A number of resins including the above-specified resin and other novolac resins are known as the undercoat organic film material for the bi- or trilayer resist process, and any of them can be used herein. Although novolac resins are less heat resistant, heat resistance is improved by incorporating a polycyclic skeleton instead of some or all cresol (see JP-A 2005-128509). A hydroxystyrene resin may also be selected where an inorganic film is formed at low temperature, and the etching resistance of this resin is also increased by incorporation of a polycyclic skeleton, for example, by copolymerizing indene, fluorene or the like.

In a case where heat resistance is required in connection with the formation of inorganic film, polyimide resins may also be used (see JP-A 2004-153125).

For the bilayer resist process or the trilayer resist process using a coated SOG film, the invention eliminates any concern about the problem of intermixing with the overlying layer, because the film to be formed on the undercoat resin film is not formed by applying a solution. Then the invention eliminates a need for crosslinkage between resins in the undercoat film, which is advantageous in that at the end of substrate processing, the undercoat film which is now superfluous can be easily removed by such means as solution peeling using an organic solvent.

The solvents used for dissolving the resin include propylene glycol monomethyl ether acetate (PGMEA), diethylene glycol dimethyl ether, 1-ethoxy-2-propanol, ethyl lactate, propylene glycol monomethyl ether, and mixtures thereof. About 200 to 100,000 parts, especially about 300 to 50,000 parts by weight of the solvent is used per 100 parts by weight of the resin for dissolution, followed by coating.

In general, a wide range of allowance for the thickness of the undercoat organic film is one of the advantages of the multilayer resist process. In the invention, better results are obtained over a thickness range of 30 to 20,000 nm, especially 50 to 15,000 nm for the undercoat organic film, though partially depending on the material of a patternable substrate and processing conditions.

Next, an inorganic silicon oxide film is formed on the undercoat film. With respect to the film forming conditions, for example, JP-A 7-183194 discloses the conditions under which a film can be formed at a relatively low temperature. Specifically, a silicon oxide film of higher uniformity having a thickness of 200 nm is formed by using an ECR plasma system, feeding $SiH_4$ (20 ml/min) and $N_2O$ (40 ml/min) as a source gas, and operating at a gas pressure of 0.1 Pa, a microwave power of 1,500 W, a plasma density of $3\times10^{11}/cm^3$, an RF bias power of 0 W, and a substrate temperature of 150° C.

The method of forming a silicon oxide film is not limited to the above method using a lower process temperature. As disclosed in JP-A 2004-153125, when a heat resistant resin such as polyimide is used as the undercoat organic film material, a method using a process temperature of 400° C. or higher is employable.

In case where the undercoat organic film is finally removed by applying a solvent for dissolving away, however, some resins used for the undercoat organic film, which have undergone high temperature treatment, have a possibility that the undercoat organic film is not effectively dissolved in a solvent. For this reason, the process temperature at this stage is preferably lower. In a commonly used plasma CVD system, the process temperature of the substrate can be lowered by using an aminosilane as the reactant gas. As will be described later, the atomic layer deposition (ALD) method is capable of forming a film of uniformity at a low temperature. With this method, the problem of defects in the inorganic intermediate film can be mitigated even at a reduced film thickness.

Next, a silicon-containing resin film is formed on the silicon oxide film. Specifically, the silicon-containing film forming composition (Solution #2) is spin coated onto a substrate and baked at 250° C. for one minute to form an ARC of 100 nm thick.

Further, a photoresist film is formed on the ARC. Specifically, a resist composition for ArF excimer laser lithography was prepared by dissolving 10 parts by weight of a resin, identified below, 0.2 part by weight of triphenylsulfonium nonafluorobutanesulfonate as a photoacid generator and 0.02 part by weight of triethanolamine as a basic compound in 600 parts by weight of propylene glycol monomethyl ether acetate (PGMEA).
Resin:

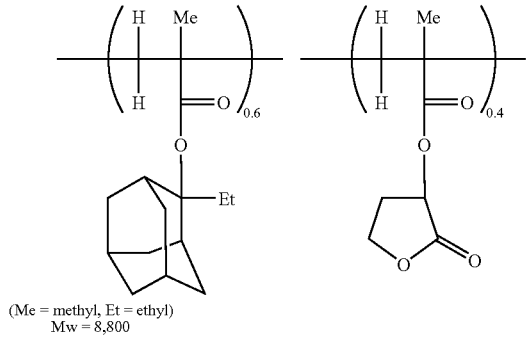

(Me = methyl, Et = ethyl)
Mw = 8,800

The resist composition is spin coated onto the silicon-containing resin film on substrate and baked at 120° C. for 60 seconds to form a resist layer of 250 nm thick.

It is understood that as the resist composition used herein, any ordinary organic resist compositions excluding silicon-containing resist compositions may be applied in addition to the above. The resist composition may be either positive or negative, and either chemically amplified or not. In fact, the resist composition which is used in the pattern feature size processing with which the lithography process of the invention is advantageously used is a chemically amplified resist composition.

A number of chemically amplified resist compositions have been disclosed including those for KrF excimer laser lithography comprising aromatic skeleton resins and those for ArF excimer laser lithography comprising aliphatic polycyclic skeleton resins. In the pattern forming process of the invention, any known resist compositions may be used. In fact, ArF exposure is necessary in order to use the resist composition at a pattern rule equal to or less than 65 nm.

In this example, the undercoat organic film has a thickness of 300 nm, the inorganic silicon oxide film has a thickness of 200 nm, the ARC has a thickness of 100 nm, and the photoresist film has a thickness of 250 nm.

It is now described how to process the respective layers.

For the resist film, a standard processing procedure involves selection of a light source corresponding to the type of resist film, for example, KrF excimer laser, ArF excimer laser or $F_2$ laser light, imagewise light exposure, treatments selected for the type of resist film, and development, thereby forming a resist pattern. In the case of the above-specified resist film, it is exposed on an ArF laser stepper S305B (Nikon Corporation, NA 0.68, σ 0.85, 2/3 annular illumination, Cr mask), then baked (PEB) at 110° C. for 90 seconds, and developed with a 2.38 wt % aqueous solution of tetramethylammonium hydroxide (TMAH), thereby giving a 110-nm line-and-space pattern. On the resulting positive pattern, no defects like footing are observable.

Next, an organic material is dry etched under conditions under which an etching rate of silicon oxide is dominantly high, while using the resist pattern as an etching mask. Specific dry etching is performed using a dry etching instrument TE-8500P by Tokyo Electron Ltd., and under conditions: a chamber pressure of 40 Pa, an RF power of 1,300 W, a gap of 9 mm, a $CHF_3$ gas flow rate of 30 ml/min, a $CF_4$ gas flow rate of 30 ml/min, and an Ar gas flow rate of 100 ml/min. When the ARC and silicon oxide film are processed by dry etching under these conditions, a patterned silicon oxide film is obtainable while substantially eliminating the influence of pattern changes by side etching of the resist film.

In a comparative example, a resist film of 250 nm thick is kept unchanged, and a non-siliceous antireflective coating of 80 nm thick (ARC39 by Nissan Chemical Co., Ltd.) is used. The ARC is removed by reactive dry etching with an oxygen plasma under conditions: a chamber pressure of 60 Pa, an RF power of 600 W, a gap of 9 mm, a $O_2$ gas flow rate of 60 ml/min, and an Ar gas flow rate of 40 ml/min. The silicon oxide film is processed by dry etching with a fluorine gas plasma as described above. The attack of the oxygen plasma exerts an effect of side etching of the resist film. It is observed that the remaining pattern of the silicon oxide film is thinned.

Next, the undercoat organic material film is dry etched under conditions under which an etching rate of the undercoat organic material is dominantly high relative to the substrate having the patterned silicon oxide film and the silicon oxide film. Specifically, reactive dry etching with an oxygen plasma is carried out under conditions: a chamber pressure of 60 Pa, an RF power of 600 W, a gap of 9 mm, a $O_2$ gas flow rate of 60 ml/min, and an Ar gas flow rate of 40 ml/min. Through this etching, the exposure pattern in the form of a resist pattern is transferred to the undercoat organic film at a high accuracy.

The dry etching methods used herein include the above-described method using an oxygen-containing gas plasma and a method using a hydrogen/nitrogen-containing gas plasma. Through this etching step, a pattern of the undercoat organic film material is produced, and at the same time, the uppermost resist layer is lost in most cases. At this point, the outermost layer is the ARC material, or the silicon oxide film if stronger etching is carried out.

Furthermore, the patternable substrate is dry etched while using the patterned organic material film as an etching mask. If the fluorine dry etching method as described above is used again at this stage, for example, the pattern is transferred to the patternable substrate (which is silicon oxide or metal silicide) at a high accuracy. For this etching, any dry etching methods adopted in the single layer resist process may be used, and for example, a chlorine dry etching method may be carried out. If a fluorine gas plasma is used as the dry etching method, the ARC and silicon oxide film remaining on the organic material film are etched away at the same time when the patternable substrate is etched.

After the series of the above-described steps, the pattern transfer to the patternable substrate is finished. The organic film remaining on the patternable substrate may be finally removed by oxygen gas plasma or hydrogen/nitrogen etching. Where a silicon-containing inorganic film is used, the undercoat organic film need not be crosslinkable, and wet stripping with the aid of a solvent is possible.

According to the invention, an antireflective silicon-containing film having a high etching selectivity ratio relative to resist, that is, a high etching speed is provided. This antireflective silicon-containing film has a sufficient extinction coefficient to exert an antireflective effect. The resist profile as patterned is perpendicular and free of drawbacks including reverse tapering and footing.

Japanese Patent Application No. 2005-335264 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An antireflective coating for use in a photolithography process using exposure light with a wavelength of up to 200 nm, said antireflective coating being formed from a coating composition comprising a silicon-containing polymer, an acid generator, and an organic solvent, wherein said silicon-containing polymer satisfies the expression $$0.05 \leq M/(L+M+N) \leq 0.14$$

in which L is the number of Si—O bonds, M is the number of Si—Si bonds, and N is the number of Si—C bonds per polymer unit weight, and said silicon-containing polymer is obtained through co-hydrolytic condensation of a silane mixture comprising a plurality of silicon-silicon bond-containing hydrolyzable silane compounds having the general formula (1):

$$R_{(6-m)}Si_2X_m \tag{1}$$

wherein each R is independently a substituted or unsubstituted monovalent hydrocarbon group of 1 to 20 carbon atoms, each X is independently an alkoxy group, an alkanoyloxy group, or a halogen atom, and m is a number from 3 to 6 provided that the compound of formula (1) wherein m is 3 or 4 is predominant, and at least one hydrolyzable silane compound having the general formula (2):

$$A_aSiB_{(4-a)} \tag{2}$$

wherein each A is independently hydrogen or a substituted or unsubstituted monovalent hydrocarbon group of 1 to 20 carbon atoms, each B is independently an alkoxy group, an alkanoyloxy group, or a halogen atom, and a is 0 or 1, and wherein said silicon-containing polymer has a weight average molecular weight of up to 20,000, with a polymer having a weight average molecular weight of up to 500 being present in an amount of up to 5% by weight of the entire silicon-containing polymer.

2. The antireflective coating of claim 1, wherein the mixture contains the silane compound of formula (1) wherein m is 4 and the silane compound of formula (1) wherein m is 3 in a molar ratio between 3:7 and 7:3.

3. The antireflective coating of claim 1, wherein said wavelength is a wavelength of 193 nm of an ArF excimer laser.

4. The antireflective coating of claim 1, wherein
R is methyl, ethyl, n-propyl, isopropyl, or vinyl, and
X is methoxy, ethoxy, n-propoxy, isopropoxy, acetyl, or chloro.

* * * * *